(12) United States Patent
Wolcott

(10) Patent No.: US 6,370,202 B1
(45) Date of Patent: Apr. 9, 2002

(54) SELF-SELECTIVE MULTI-RATE TRANSMITTER

(75) Inventor: Theodore J. Wolcott, San Jose, CA (US)

(73) Assignee: Lockheed Martin Corporation, Bethesda, MD (US)

(*) Notice: Subject to any disclaimer, the term of this patent is extended or adjusted under 35 U.S.C. 154(b) by 0 days.

(21) Appl. No.: 09/197,902

(22) Filed: Nov. 23, 1998

(51) Int. Cl.[7] .................. H04L 27/04; H04L 27/12; H04L 27/20
(52) U.S. Cl. ............... 375/295; 375/259; 714/756; 370/538
(58) Field of Search ............... 375/265, 295, 375/130, 140, 141, 146, 259; 714/756; 370/538, 466

(56) References Cited

U.S. PATENT DOCUMENTS 4,965,787 A * 10/1990 Almond et al. ............. 370/466
4,980,897 A * 12/1990 Decker et al. ............. 375/265

* cited by examiner

*Primary Examiner*—Chi Pham
*Assistant Examiner*—Phuong Phu
(74) *Attorney, Agent, or Firm*—Kenneth W. Float

(57) ABSTRACT

An architecture for a self-selective multi-rate transmitter that processes variable input rate data using a plurality of single input, multiple output interleavers. The transmitter, using a multitude of modulation formats, transmits the data at a constant symbol rate without a priori knowledge of the input rate. The transmitter employs a modulator that automatically selects between a multitude of signal constellations, depending on the rate of the source data to be transmitted. The modulator transmits data from various sources, each with an independent data rate. The modulator performs data formatting, forward error correction encoding, modulation onto an intermediate frequency, frequency conversion to a transmit radio frequency, and amplification with automatic gain control.

15 Claims, 6 Drawing Sheets

SELF-SELECTIVE MULTI-RATE TRANSMITTER

BACKGROUND

The present invention relates generally to transmitter architectures, and more particularly, to a transmitter architecture that is capable of accepting variable input rate data and, using a multitude of modulation formats, transmit the data at a constant symbol rate without a priori knowledge of the input rate.

Communication systems are commonly required to transmit data from a number of different sources. Often, the data rates vary among these sources, requiring the transmitter to accommodate a range of input data rates. Variable rate systems can be much more complicated than systems that operate with a single clock rate. A programmable transmit module developed by the assignee of the present invention is a prime example of this. One such programmable transmit module is disclosed in U.S. patent application Ser. No. 08/543,814, filed Nov. 16, 1995 and assigned to the assignee of the present invention. The forward error correction circuit used in the programmable transmit module must operate at all rates, requiring a very complicated clocking scheme. Additionally, switching data rates often requires reconfiguration of the transmitter by way of a command of some sort.

Therefore, it would be desirable to have a transmitter architecture that is more flexible than conventional designs, and which is capable of accepting variable input rate data and, using a multitude of modulation formats, transmit the data at a constant symbol rate without a priori knowledge of the input rate.

SUMMARY OF THE INVENTION

The present invention comprises a self-selective multi-rate transmitter, that includes a plurality of single input, multiple output interleavers receive variable rate input data and generate parallel output data streams that are a function of the data rate of the input data, and that correspond to uncoded k-bit symbols of an M-ary signal constellation. The interleavers are coupled to a modulator that processes the uncoded k-bit symbols to generate the M-ary signal constellation that is a function of the number of parallel output data streams generated by the interleavers. An exemplary modulator used in the transmitter includes a forward error correction circuit that generate n parallel channels of coded data, one parallel channel for each bit in the required M-ary signal constellation, a vector modulator, an upconverter, and an amplifier.

The present invention thus provides for an architecture for a self-selective multi-rate transmitter that is capable of accepting variable input rate data and, using a multitude of modulation formats, transmit the data at a constant symbol rate without a priori knowledge of the input rate. The majority of the self-selective multi-rate transmitter operates at a constant clock rate, greatly reducing the complexity of the forward error correction circuitry and other circuits.

The self-selective multi-rate transmitter employs a modulator that automatically selects between a multitude of signal constellations, depending on the rate of the source data to be transmitted. By doing so, the modulator is used to transmit data from various sources, each with an independent data rate. The modulator performs data formatting, forward error correction encoding, modulation onto an intermediate frequency, frequency conversion to a transmit radio frequency, and amplification with automatic gain control.

Each single-input multiple-output interleaver provides a multiple of parallel data channels to the forward error correction circuitry. The data is conveyed over a varying number of the parallel channels. The forward error correction and modulation are arranged such that the proper signal constellation is automatically addressed by the active data channels.

The present transmitter eliminates the need for the proper modulation format to be identified and selected, either through rate detection or commanding of the transmitter. The present transmitter is capable of operating autonomously, providing the proper waveform with no interaction or complex rate detection.

BRIEF DESCRIPTION OF THE DRAWINGS

The various features and advantages of the present invention may be more readily understood with reference to the following detailed description taken in conjunction with the accompanying drawings, wherein like reference numerals designate like structural element, and in which.

DETAILED DESCRIPTION

Figure 1:
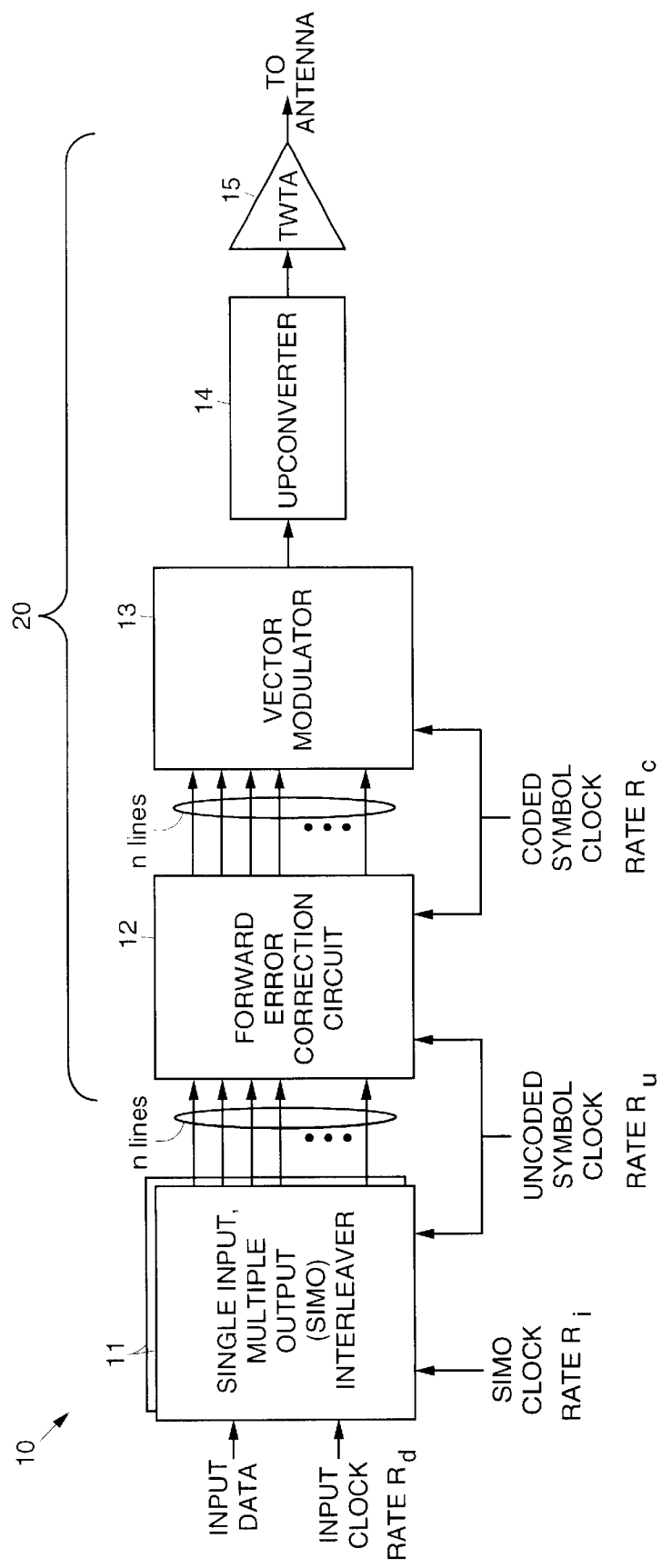
FIG. 1 illustrates an exemplary embodiment of a self-selective multi-rate transmitter in accordance with the principles of the present invention.

Referring to the drawing figures, FIG. 1 illustrates an exemplary embodiment of a self-selective multi-rate transmitter 10 in accordance with the principles of the present invention. The self selective multi-rate transmitter 10 comprises two single input, multiple output (SIMO) interleavers 11 that are each coupled to a modulator 20. The modulator 20 comprises a forward error correction circuit 12, a vector modulator 13, an upconverter 14, and an amplifier 15, such as a traveling wave tube amplifier (TWTA) 15 or solid state power amplifier 15. The output of the traveling wave tube amplifier 15 drives an antenna.

Each SIMO interleaver 11 accepts input data at an input rate of $R_d$ bits per second, where $R_d$ is less or equal to the maximum input rate of $R_{max}$ bits per second. Every $1/R_i$ seconds (the time it takes to fill the SIMO interleavers 11 at the maximum input rate), the SIMO begins outputting the stored data as k parallel data channels. The two interleavers 11 are operated in a ping-pong configuration. Thus, while one interleaver 11 is being filled, the other outputs data.

Outputs of the SIMO interleaver 11 are clocked at a fixed rate, $R_u$, as uncoded k-bit symbols. In the modulator 20, the forward error correction circuit 12 accepts the uncoded symbols at the same rate. The coded symbols at the output of the forward error correction circuit 12 are clocked at rate $R_c$. The coding scheme is chosen such that the forward error correction circuit 12 produces n parallel channels of coded data.

The architecture of the transmitter 10 allows transmission of variable rate data using different modulation formats with less complexity than traditional variable rate transmit architectures. The single input, multiple output (SIMO) interleaver 11 accepts variable rate data and generates the proper number of parallel output data streams, depending on the data rate. The faster the data rate, the more parallel streams are generated, one parallel stream for each bit in the required M-ary signal constellation.

Another key to the architecture of the transmitter 10, which allows the transmitter 10 to operate without a priori knowledge of the input rate, is the constellation mapping employed in the vector modulator 13. By making proper bit-to-symbol assignments in the vector modulator 13, the constellation used during transmission is a function of the number of parallel data streams.

With the exception of the SIMO interleaver 11, clock rates in the modulator 20 are independent of the input data rate. The SIMO interleaver 11 performs the required operation with no a priori knowledge of the input data rate. Therefore the transmitter 10 does not need to be reconfigured for different input data rates. Since the transmitter 10 selects the proper modulation format for the input data rate, without commanding, it is a self selective multi-rate transmitter 10.

The vector modulator 13 is similar to a vector modulator developed by the assignee of the present invention and disclosed in U.S. Pat. No. 5,463,355, entitled "Wideband Vector Modulator", for example, which is assigned to the assignee of the present invention. As modulated array transmitter technology matures, a modulated array transmitter may replace the vector modulator 13, upconverter 14, and traveling wave tube amplifier 15 (i.e., the modulator 20). The assignee of the present invention has developed a modulated array transmitter which is disclosed U.S. Pat. No. 5,612,651, entitled "Modulating Array QAM Transmitter", for example. However, no matter which transmitter 10 is used, care must be taken in locating the symbols and the corresponding bit assignments. Proper symbol location and bit assignment are key to the functionality of the self-selective multi-rate transmitter 10.

The structure and operation of the SIMO interleavers 11 are described in detail below and with reference to FIG. 2. Rather than immediately describing the forward error correction circuit 12, the vector modulator 13 and its relation to the SIMO inter-leaver 11 will be discussed as if the transmitter 10 is uncoded. The symbol location and bit assignments are described, completing a conceptual view of the self-selective multi-rate transmitter 10. The forward error correction circuit 12 will be described after the SIMO interleavers 11 and vector modulator 13 are described.

The general architecture and functionality of the single input, multiple output (SIMO) interleaver 11 will first be discussed. The use of two SIMO interleavers 11 will then be discussed. For illustrative purposes, a 6 output (k=6) SIMO interleaver 11 is described. The same principles may be applied to any size SIMO interleaver 11.

Figure 2:
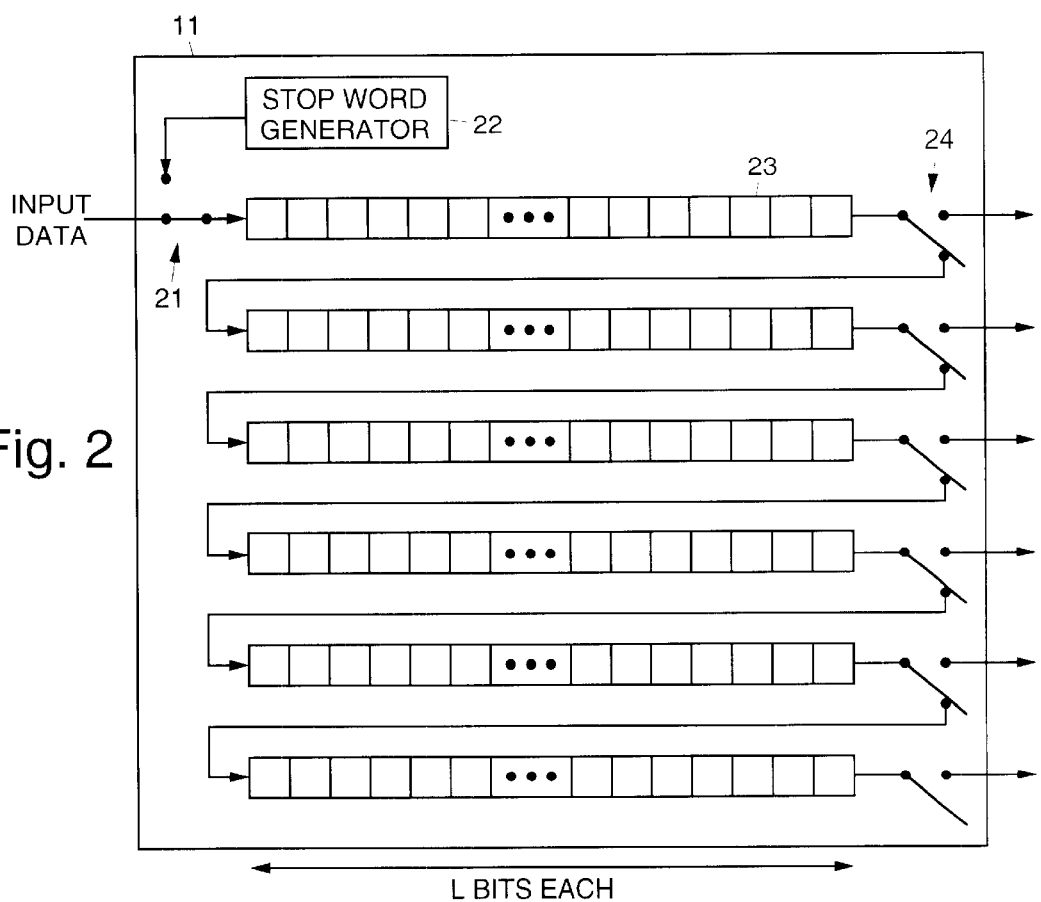
FIG. 2 illustrates a single input, multiple output interleaver used in the transmitter of FIG. 1.

A conceptual block diagram of the SIMO interleaver 11 is shown in FIG. 2. The SIMO interleaver 11 comprises an input switch 21 that is coupled to a stop word generator 22 and a plurality of FIFO registers 23. The first register 23 has its input coupled to the input switch 21 and has it output coupled to an output switch 24. The output switch 24 selectively generates an output from the interleaver 11 or couples the output of the first register to the second register 23. A total of six registers 23 are shown that are interconnected by corresponding output switches 24.

The operation of the SIMO interleaver 11 is relatively simple. SIMO interleavers 11 with 6 outputs, such as the one shown in FIG. 2, are required for a maximum modulation order of 64-each 64-ary symbol represents 6 bits. Higher order modulation is possible using this architecture, but is not described herein. For each of the outputs of the SIMO interleaver 11, there is an L bit FIFO register 23. Conceptually, the registers 23 are tied together such that the first bit into the interleaver 11 ends up in the rightmost location of the bottommost register 23. A stop word generator 22 is also shown which will be described later.

First, ignoring the stop word generator 22, consider input data arriving at a nominal maximum data rate of $R_d=R_{max}$ bits per second. The corresponding bit period is $T_d=1/R_{max}$. All six FIFO registers 23 are filled after 6L bit periods, or 6L/Rmax seconds. Once all six FIFO registers 23 are full, all output switches 24 are flipped and the data is pushed out of the interleaver 11 as 6 parallel sequences of length L. At the same time, the input data is routed to the other interleaver 11 where the process is repeated. By the time the other interleaver 11 begins pushing its data out, the first interleaver 11 is ready to accept data.

Thus, in this form, the SIMO interleaver 11 corresponds to a serial to parallel converter combined with an interleaver. The output switches 24 and the switching between interleavers is controlled by a SIMO clock, shown in FIG. 1, with a period $T_i=6L/R_{max}(R_i=1/T_i)$. The 6-tuples at the output of the interleaver 11 may be used to address the symbols in a 64QAM constellation directly.

Now, consider input data arriving at a rate $R_d>R_{max}$. Since the data arrives more slowly, it takes more than $T_i$ seconds to fill the registers 23. Therefore, when the SIMO clock toggles the switches 24, the registers 23 are not fill. If the data arrives at a rate less than or equal to $1/6\ R_{max}$, only register (1) contains data. If $1/6\ R_{max}>R_d>1/3\ R_{max}$, the data resides in registers (1) and (2), and so forth.

If register (1) is the only register that contains the desired data ($R_d \leq 1/6\ R_{max}$) the elements of all other registers can be set to zero (by initializing the registers to zero, there is no need to fill them at this time). Then, the regular procedure of shifting the data out of the interleaver 11 can commence. However, the 6-tuples at the output of the interleaver 11 can only take on two values: 000000 and 000001. Thus, if the constellation is configured properly, antipodal binary signaling results.

Likewise, if registers (1) and (2) contain data ($1/6\ R_{max} \leq R_d \leq 1/3\ R_{max}$), registers (3), (4), (5), and (6) will contain zeros. The 6-tuples resulting when the registers are emptied are elements of the set 1000000, 000001, 000010, 0000111. Again, with proper constellation configuration, the result is 4-ary modulation. Similarly, if registers (1) through (3) contain data ($1/3\ R_{max} \leq R_d \leq 1/2\ R_{max}$), the result is 8-ary modulation. If registers (1) through (4) contain data ($1/2\ R_{max} \leq R_d \leq 2/3\ R_{max}$), the result is 16-ary modulation. If ($2/3\ R_{max} \leq R_d \leq 5/6\ R_{max}$), 32-ary modulation results. Finally, if $5/6\ R_{max} \leq R_d \leq R_{max}$), 64-ary modulation is generated.

It would be beneficial if the data arrived at some multiple of $R_{max}/6$, up to $R_{max}$. If that were true, none of the FIFO registers 23 would ever be partially full at time $t=NT_i$, N=1, 2, etc. However, this may not be the case. Therefore, it is possible to have partially filled registers 23. By adding a short word to the end of the sequence (added to the partially empty register 23) using the stop word generator 22, the receiver has a marker to identify the end of the data and the start of the zero fill. The same stop word may be used for synchronization at the receiver.

It is to be understood that a multiple input, single output (MISO) deinterleaver is required at a receiver (not shown) that cooperates with the transmitter 10. The multiple input, single output deinterleaver reverses the process shown in FIG. 2. A serial sequence generated at the nominal bit rate $R_{max}$ can be truncated at the end of the data block (using the stop word if necessary). The result is variable length data blocks or packets with zero stuff bits arriving at a single packet rate.

The configuration of the vector modulator 13 will now be discussed. Selection and labeling of the transmit constellation is important to the operation of the self-selective multi-rate transmitter 10. A constellation configuration appropriate for the example given above will now be discussed with modulations selected from the group 64-ary, 32-ary, 16-ary, 8-ary, 4-axy, and binary.

There are a number of possible configurations, which may or may not result in the same performance. Therefore, the configuration of the vector modulator 13 described herein may not be optimum. The rules given for the configuration may only be a subset for ideal operation.

The constellation must be addressable by a varying size k-tuple. That is, if only the LSB changes, the input is equivalent to a single bit address. The two possible addresses, 000000 and 000001 must correspond to points in the constellation with as much separation as possible (binary antipodal).

When the two least-significant bits are valid, there are 4 possible addresses. These addresses must correspond to 4 signal points with good distance properties. The 4 possible addresses, 000000, 000001, 000010 and 000011, include the binary addresses associated with antipodal signaling. Thus, the constellation points used for 4-ary modulation must include the points used for binary modulation.

It is the same for 8-ary modulation. The possible addresses, 000000, 000001, 000010, 000011, 000100, 000101, 000110 and 000111 must correspond to 8 constellation points with good distance properties and must include, by default, the 4-ary signal points. This continues such that the 32-ary points are a subset of the 64-ary points, the 16-ary points are a subset of the 32-ary points, and so on.

Because the sets of signal points for the various modulations are subsets of the sets of points for higher order modulation, choices may be limited. Whereas one might be able to identify some very good 8-ary points out of the set of 64-ary points, one is limited in selecting from the set of 16-ary points. Therefore, the distance properties may not be optimum. It will become clear through the example below that reasonably good distance properties can be achieved.

Figure 3:
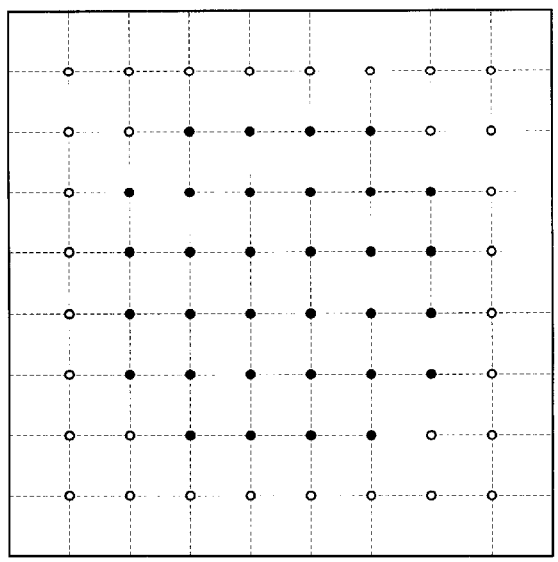
FIG. 3 illustrates a 64-ary constellation showing 32-ary.
Figure 4:
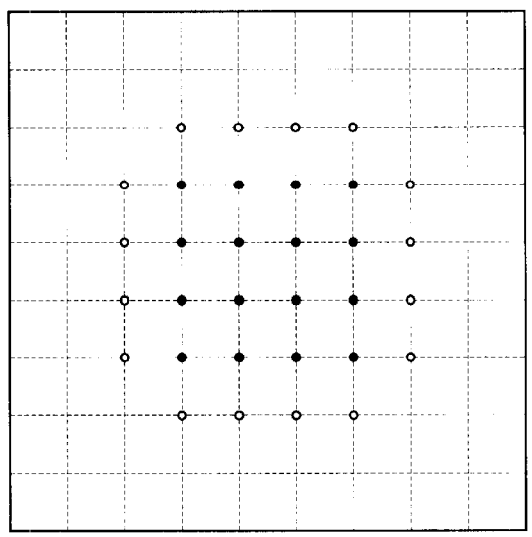
FIG. 4 shows the 32-ary constellation identified in FIG. 3.

By way of example, define the 64-ary constellation to be standard 64QAM. First, ignoring the bit assignments, pick points for the various constellations. FIG. 3 shows a 64QAM constellation. In FIG. 3, all of the 64QAM points are identified with a circle. The 32-ary points that were chosen are darkened circles (in this case, a standard 32CROSS constellation). FIG. 4 shows a 32-ary constellation identified in FIG. 3 and shown as circles. Also shown as darkened circles is a 16-ary constellation. Again, it is a standard 16QAM constellation.

Figure 5:
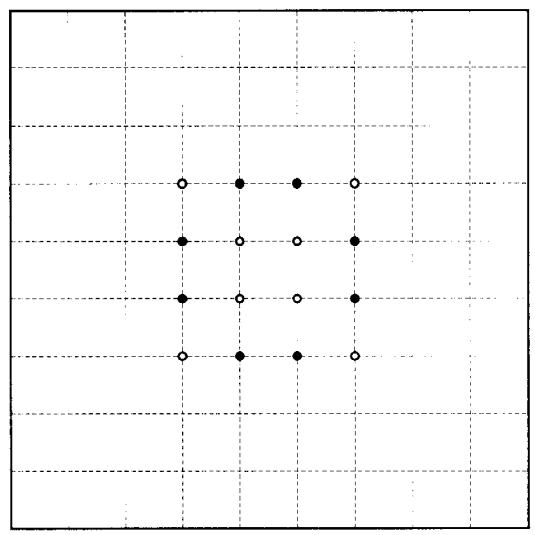
FIG. 5 illustrates a 16-ary constellation showing 8-ary.

The selected 16-ary constellation is shown as circles in FIG. 5 along with one possible 8-ary constellation shown as darkened circles. This is not necessarily the best 8-ary configuration possible out of all of the 64-ary points. However, when limited to the 16-ary points, it is the one most resembling 8PSK.

As a result of automatic gain control (AGC), all of these constellations are amplified such that the average signal power is at a proper back-off level. Thus, multi-amplitude constellations such as 64-, 32- and 16-ary may have their corner points at the saturation point. Constant modulus signals such as 8-, 4-, and 2-ary have peak to average power ratios very close, if not equal to, 1. Therefore, the 8-ary distance properties is improved over the 16-ary for the points selected here.

Figure 6:
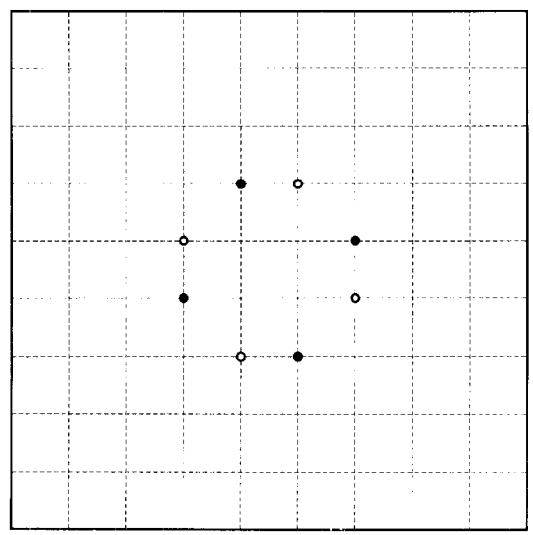
FIG. 6 illustrates a 8-ary constellation showing 4-ary.
Figure 7:
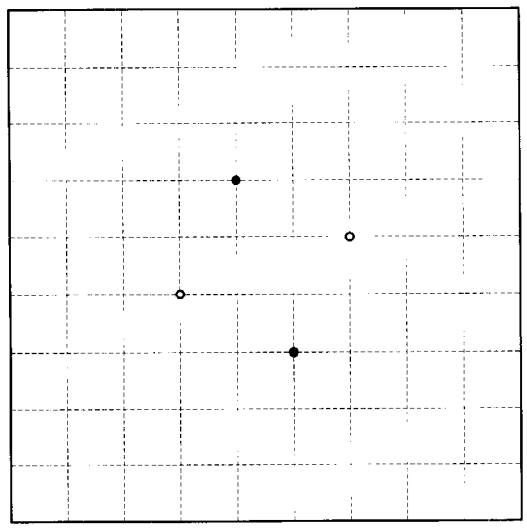
FIG. 7 illustrates a 4-ary constellation showing binary.

FIG. 6 illustrates an 8-ary constellation shown as circles with a very good set of 4-ary points shown as darkened circles. FIG. 7 shows the selection of binary points within the set of 4-ary points.

Figure 8:
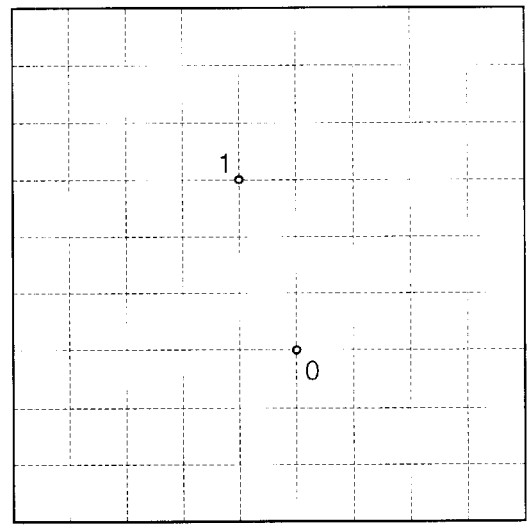
FIG. 8 illustrates a 2-ary constellation bit assignments.
Figure 9:
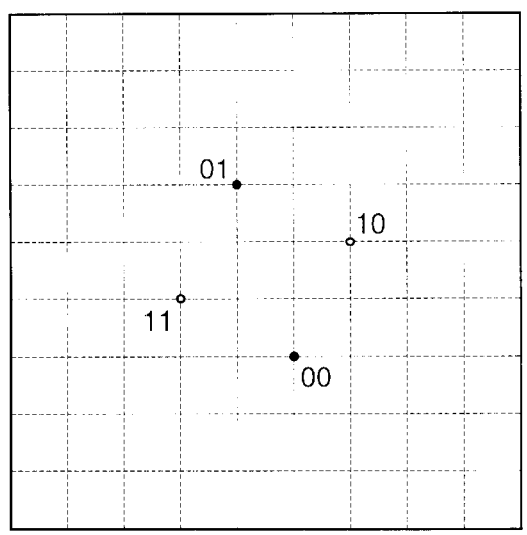
FIG. 9 illustrates 4-ary constellation bit assignments.
Figure 10:
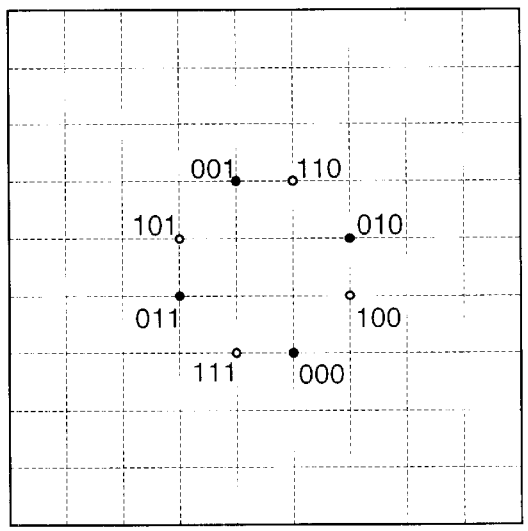
FIG. 10 illustrates 8-ary constellation bit assignments.
Figure 11:
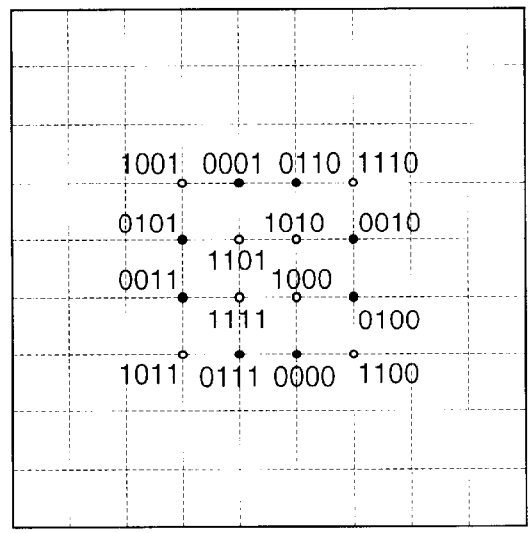
FIG. 11 illustrates 16-ary constellation bit assignments.
Figure 12:
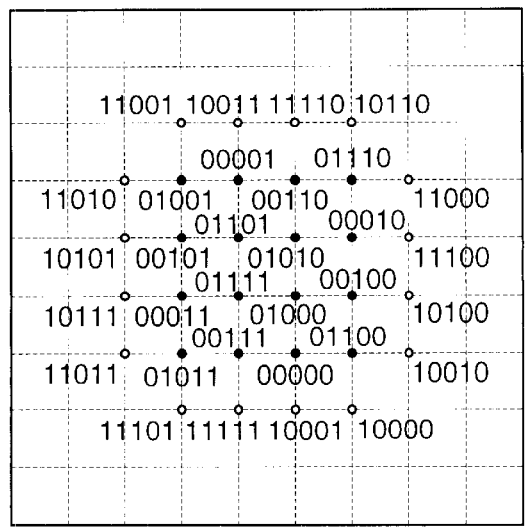
FIG. 12 illustrates 32-ary constellation bit assignments.

Numbering the points begins with the binary constellation. Again, this is only one way to number the points. Any number of combinations will work. The bit assignments that result in the best performance typically depend on the selected coding. The points are numbered, progressing from 2-ary (binary) shown in FIG. 8, 4-ary shown in FIG. 9, 8-ary shown in FIG. 10, 16-ary shown in FIG. 11, to 32-ary shown in FIG. 12. At each step, only the minimum number of bits are shown.

Figure 13:
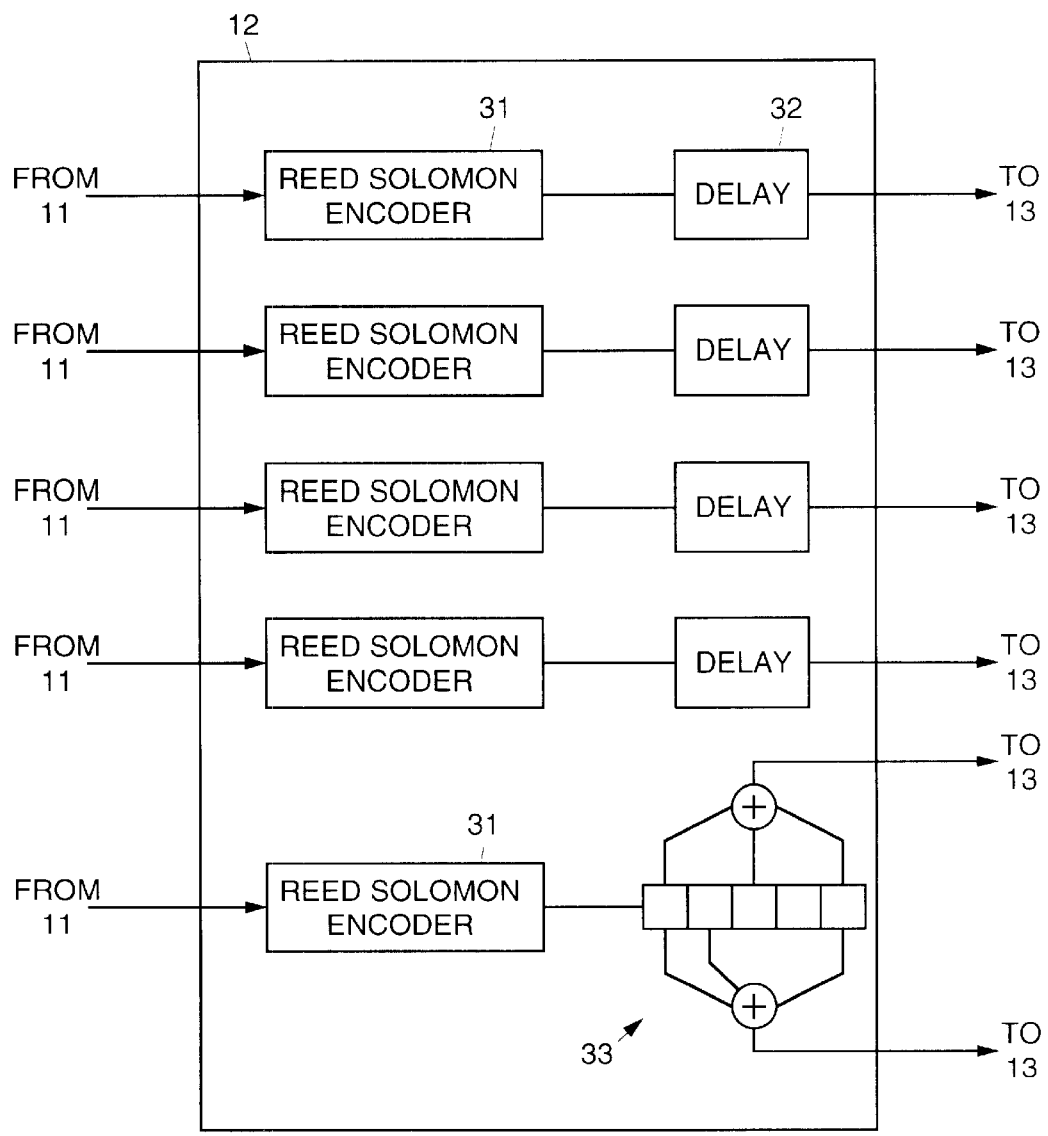
FIG. 13 illustrates an exemplary forward error correction circuit used in the transmitter of FIG. 1.

The forward error correction circuit 12 will be discussed with reference to FIG. 13. A relatively simple forward error correction scheme is used to demonstrate how the forward error correction circuit 12 works. The forward error correction circuit 12 is shown as comprising a plurality of inputs that are coupled to a corresponding plurality of Reed-Solomon encoders 31. Outputs of all but the last Reed-Solomon encoder 31 (i.e., the k–1 encoders 31) are delayed by a corresponding plurality of delay circuits 32. The last Reed-Solomon encoder 31 shown at the bottom of FIG. 13 drives a shift register and adder circuit 33, which performs convolutional encoding. The delay circuits 32 at the outputs of the k–1 Reed-Solomon encoders 31 serve to make sure the data is lined up. It takes time for the data at the output of the bottom Reed-Solomon encoder 31 to be convolutionally encoded by the shift register and adder circuit 33. Therefore, each of the outputs of the other Reed-Solomon encoders 31 are delayed by the same amount. The delay circuits 32 are simple shift registers with one input and one output (no adders). The number of delay elements (cells in the shift register) depends on the convolutional coding/decoding scheme.

Consider a Reed-Solomon outer code with a rate (k+1)/k pragmatic trellis code modulation (TCM) inner code. In this configuration, the Reed-Solomon outer code is applied to the individual data streams. A rate 1/2 convolutional code, with parallel outputs is applied to the LSB while the k–1 more significant bits are left uncoded. The resulting configuration is shown in FIG. 13. The number of outputs of the forward error correction circuit 12 is chosen as 6 such that 64QAM is the largest constellation size. Since there can be no less than 2 active outputs, 4-ary is the smallest constellation. With 6 outputs, the exemplary forward error correction circuit 12 requires 5 inputs.

Operations performed by the forward error correction circuit 12 are performed at a common sample rate. The Reed-Solomon code normally requires a clock rate translation. However, by clocking the data into the encoder at the output rate, holding it in a buffer, and then encoding it as a block, this can be done. An alternative is to use an input clock for the forward error correction circuit 12 and a corresponding output rate clock.

The architecture described above is only one of many variations on a common theme. Using the same concept, parallel channels may be employed to reduce the required clock rate of the forward error correction circuit 12, for example. Such parallelization requires the SIMO interleavers 11 to be configured in parallel, one register 23 per parallel forward error correction circuit 12. A number of different coding schemes may also be employed. Finally, the modulation scheme may be varied along with the bit-to-symbol assignments.

Thus, a transmitter architecture that is more flexible than conventional designs, and which is capable of accepting variable input rate data and, using a multitude of modulation formats, transmit the data at a constant symbol rate without a priori knowledge of the input rate has been disclosed. It is to be understood that the described embodiments are merely illustrative of some of the many specific embodiments which represent applications of the principles of the present invention. Clearly, numerous and other arrangements can be readily devised by those skilled in the art without departing from the scope of the invention.

What is claimed is:

1. A self-selective multi-rate transmitter, comprising:

first and second single input, multiple output interleavers that each receive input data having a variable data rate and generate a desired number of parallel output data streams depending on the data rate of the input data and without a priori knowledge of the data rate of the input data, that correspond to uncoded k-bit symbols of an M-ary signal constellation; and a modulator coupled to outputs of the interleavers that processes the uncoded k-bit symbols to generate the M-ary signal constellation that is a function of the number of parallel output data streams generated by the interleavers.

2. The transmitter recited in claim 1 wherein the modulator comprises:

a forward error correction circuit coupled to outputs of the interleavers that generate n parallel channels of coded data, one parallel channel for each bit in the required M-ary signal constellation;

a vector modulator coupled to outputs forward error correction circuit;

an upconverter coupled to an output of the vector modulator; and an amplifier coupled to an output of the upconverter.

3. The transmitter recited in claim 1 wherein the modulator comprises:

a forward error correction circuit coupled to outputs of the interleavers that generate n parallel channels of coded data, one parallel channel for each bit in the required M-ary signal constellation;

a modulated array transmitter coupled to outputs forward error correction circuit; and an upconverter coupled to an output of the modulated array transmitter.

4. The transmitter recited in claim 1 wherein the amplifier comprises a traveling wave tube amplifier.

5. The transmitter recited in claim 1 wherein the amplifier comprises a solid state power amplifier.

6. The transmitter recited in claim 1 wherein the single input, multiple output interleaver comprises:

an input switch for receiving the variable rate input data;

a stop word generator coupled to the input switch for selectively adding a stop word to the data; and a plurality of registers that are selectively coupled together by way of a plurality of output switches.

7. The transmitter recited in claim 1 wherein the forward error correction circuit comprises:

a plurality of Reed-Solomon encoders having a plurality of inputs coupled to the outputs of the interleavers;

a plurality of delay circuits coupled to outputs of all but the last Reed-Solomon encoder; and drives a shift register and adder circuit, which performs convolutional encoding, coupled to the last Reed-Solomon encoder.

8. The transmitter recited in claim 2 wherein the amplifier comprises a traveling wave tube amplifier.

9. The transmitter recited in claim 2 wherein the amplifier comprises a solid state power amplifier.

10. The transmitter recited in claim 2 wherein the single input, multiple output interleaver comprises:

an input switch for receiving the variable rate input data;

a stop word generator coupled to the input switch for selectively adding a stop word to the data; and a plurality of registers that are selectively coupled together by way of a plurality of output switches.

11. The transmitter recited in claim 2 wherein the forward error correction circuit comprises:

a plurality of Reed-Solomon encoders having a plurality of inputs coupled to the outputs of the interleavers;

a plurality of delay circuits coupled to outputs of all but the last Reed-Solomon encoder; and drives a shift register and adder circuit, which performs convolutional encoding, coupled to the last Reed-Solomon encoder.

12. The transmitter recited in claim 3 wherein the amplifier comprises a traveling wave tube amplifier.

13. The transmitter recited in claim 3 wherein the amplifier comprises a solid state power amplifier.

14. The transmitter recited in claim 3 wherein the single input, multiple output interleaver comprises:

an input switch for receiving the variable rate input data;

a stop word generator coupled to the input switch for selectively adding a stop word to the data; and a plurality of registers that are selectively coupled together by way of a plurality of output switches.

15. The transmitter recited in claim 3 wherein the forward error correction circuit comprises:

a plurality of Reed-Solomon encoders having a plurality of inputs coupled to the outputs of the interleavers;

a plurality of delay circuits coupled to outputs of all but the last Reed-Solomon encoder; and drives a shift register and adder circuit, which performs convolutional encoding, coupled to the last Reed-Solomon encoder.

* * * * *